US006665013B1

(12) United States Patent
Fossum et al.

(10) Patent No.: US 6,665,013 B1
(45) Date of Patent: Dec. 16, 2003

(54) ACTIVE PIXEL SENSOR HAVING INTRA-PIXEL CHARGE TRANSFER WITH ANALOG-TO-DIGITAL CONVERTER

(75) Inventors: Eric R. Fossum, LaCrescenta, CA (US); Sunetra K. Mendis, Pasadena, CA (US); Bedabrata Pain, Los Angeles, CA (US); Robert H. Nixon, Shadow Hills, CA (US); Zhimin Zhou, Los Angeles, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/305,346

(22) Filed: May 3, 1999

Related U.S. Application Data

(60) Division of application No. 08/567,469, filed on Dec. 5, 1995, now Pat. No. 5,783,524, which is a continuation of application No. 08/278,638, filed on Jul. 21, 1994, now abandoned, and a continuation-in-part of application No. 08/188,032, filed on Jan. 28, 1994, now Pat. No. 5,471,515.

(51) Int. Cl.[7] .......................... H04N 3/14; H04N 5/335
(52) U.S. Cl. ................... 348/308; 348/294; 348/302
(58) Field of Search ...................... 257/292, 291, 257/294; 250/208.1; 348/294, 302, 303, 304, 308; 341/139, 142, 158; 377/60

(56) References Cited

U.S. PATENT DOCUMENTS

| | | |
|---|---|---|
| 3,623,132 A | 11/1971 | Green |
| 4,093,872 A | 6/1978 | Hartman et al. |
| 4,155,094 A | 5/1979 | Ohba et al. |
| 4,171,521 A | 10/1979 | Wang et al. |
| 4,287,441 A | 9/1981 | Smith |

(List continued on next page.)

FOREIGN PATENT DOCUMENTS

JP  5-235317  9/1993

OTHER PUBLICATIONS

S.K. Mendis, B. Pain, R.H. Nixon, E.R. Fossum, "Design of a Low–Light–Level Image Sensor with On–Chip Sigma–Delta Analog–to–Digital Conversion", Feb. 1993, Proceedings of the SPIE, vol. 1900, Charge–Coupled Devices and Solid State Optical Sensors III, pp. 31–39.

R.H. Nixon, E.R. Fossum, S.K. Mendis, B. Pain, "Design of a Low–Light–Level Image Sensor with On–Chip Sigma–Delta Analog–to–Digital Conversion", Feb. 1993, Jet Propulsion Laboratory New Technology Report, JPL & NASA Case No. NPO–19117; JPL Log No. 8706.

E.R. Fossum, S.K. Mendis, P. Pain, R.H. Nixon, "Image Sensor with On–Chip Parallel Sigma–Delta Analog–to–Digital Converter Circuits", Invention Evaluation Questionnaire, Jan. 28, 1994, NASA Case No. 19117/8706.

*Primary Examiner*—Wendy R. Garber
*Assistant Examiner*—Justin Misleh
(74) *Attorney, Agent, or Firm*—Fish & Richardson P.C.

(57) ABSTRACT

An imaging device formed as a monolithic complementary metal oxide semiconductor integrated circuit in an industry standard complementary metal oxide semiconductor process, the integrated circuit including a focal plane array of pixel cells, each one of the cells including a photogate overlying the substrate for accumulating photo-generated charge in an underlying portion of the substrate, a readout circuit including at least an output field effect transistor formed in the substrate, and a charge coupled device section formed on the substrate adjacent the photogate having a sensing node connected to the output transistor and at least one charge coupled device stage for transferring charge from the underlying portion of the substrate to the sensing node and an analog-to-digital converter formed in the substrate connected to the output of the readout circuit.

12 Claims, 7 Drawing Sheets

U.S. PATENT DOCUMENTS

| | | | |
|---|---|---|---|
| 4,309,624 A | | 1/1982 | Hynecek et al. |
| 4,585,934 A | | 4/1986 | French et al. |
| 4,683,580 A | * | 7/1987 | Matsunaga .................... 377/60 |
| 4,859,624 A | | 8/1989 | Goto |
| 4,959,723 A | * | 9/1990 | Hashimoto .................. 348/302 |
| 5,097,305 A | * | 3/1992 | Mead et al. ................. 257/292 |
| 5,146,339 A | * | 9/1992 | Shinohara et al. .......... 348/301 |
| 5,184,203 A | | 2/1993 | Taguchi |
| 5,192,990 A | | 3/1993 | Stevens |
| 5,198,880 A | | 3/1993 | Taguchi et al. |
| 5,262,871 A | * | 11/1993 | Wilder et al. ................ 348/307 |
| 5,322,994 A | * | 6/1994 | Uno ......................... 250/208.1 |
| 5,323,052 A | | 6/1994 | Koyama |
| 5,363,064 A | * | 11/1994 | Mikamura .................. 330/308 |
| 5,386,128 A | * | 1/1995 | Fossum et al. .......... 257/183.1 |
| 5,463,420 A | * | 10/1995 | Yamada ....................... 348/294 |
| 5,471,515 A | | 11/1995 | Fossum et al. |
| 5,563,431 A | * | 10/1996 | Ohmi et al. ................. 257/291 |
| 5,754,705 A | * | 5/1998 | Okino ........................ 382/250 |

\* cited by examiner

ACTIVE PIXEL SENSOR HAVING INTRA-PIXEL CHARGE TRANSFER WITH ANALOG-TO-DIGITAL CONVERTER

This is a divisional of U.S. application Ser. No. 08/567,469, filed Dec. 5, 1995 now U.S. Pat. No. 5,783,524, continuation of Ser. No. 08/278,638, filed Jul. 21, 1994 now abandoned, which is a C-I-P of Ser. No. 08/188,032 filed Jan. 28, 1994, U.S. Pat. No. 5,471,515.

STATEMENT AS TO FEDERALLY SPONSORED RESEARCH

The invention described herein was made in the performance of work under a NASA contract, and is subject to the provisions of Public Law 96-517 (35 USC 202) in which the Contractor has elected to retain title.

BACKGROUND

The invention is related to semiconductor imaging devices and in particular to a silicon imaging device which can be fabricated using a standard CMOS process.

There are a number of types of semiconductor imagers, including charge coupled devices, photodiode arrays, charge injection devices and hybrid focal plane arrays. Charge coupled devices enjoy a number of advantages because they are an incumbent technology, they are capable of large formats and very small pixel size and they facilitate noiseless charge domain processing techniques (such as binning and time delay integration). However, charge coupled device imagers suffer from a number of disadvantages. For example, they exhibit destructive signal read-out and their signal fidelity decreases as the charge transfer efficiency raised to the power of the number of stages, so that they must have a nearly perfect charge transfer efficiency. They are particularly susceptible to radiation damage, they require good light shielding to avoid smear and they have high power dissipation for large arrays.

In order to ameliorate the charge transfer inefficiency problem, charge coupled device (CCD) imagers are fabricated with a specialized CCD semiconductor fabrication process to maximize their charge transfer efficiency. The difficulty is that the standard CCD process is incompatible with complementary metal oxide semiconductor (CMOS) processing, while the image signal processing electronics required for the imager are best fabricated in CMOS. Accordingly, it is impractical to integrate on-chip signal processing electronics in a CCD imager. Thus, the signal processing electronics is off-chip. Typically, each column of CCD pixels is transferred to a corresponding cell of a serial output register, whose output is amplified by a single on-chip amplifier (e.g., a source follower transistor) before being processed in off-chip signal processing electronics. As a result, the read-out frame rate is limited by the rate at which the on-chip amplifier can handle charge packets divided by the number of pixels in the imager.

The other types of imager devices have problems as well. Photodiode arrays exhibit high noise due to so-called kTC noise which makes it impossible to reset a diode or capacitor node to the same initial voltage at the beginning of each integration period. Photodiode arrays also suffer from lag. Charge injection devices also suffer from high noise, but enjoy the advantage of non-destructive readout over charge coupled devices.

Hybrid focal plane arrays exhibit less noise but are prohibitively expensive for many applications and have relatively small array sizes (e.g., 512-by-512 pixels).

What is needed is an imager device which has the low kTC noise level of a CCD and is compatible for integration with CMDS signal processing circuits.

SUMMARY

The invention is embodied in an imaging device formed as a monolithic complementary metal oxide semiconductor integrated circuit in an industry standard complementary metal oxide semiconductor process, the integrated circuit including a focal plane array of pixel cells, each one of the cells including a photogate overlying the substrate for accumulating photo-generated charge in an underlying portion of the substrate, a readout circuit including at least an output field effect transistor formed in the substrate, and a charge coupled device section formed on the substrate adjacent the photogate having a sensing node connected to the output transistor and at least one charge coupled device stage for transferring charge from the underlying portion of the substrate to the sensing node and an analog-to-digital converter formed in the substrate as a part of the integrated circuit. In a preferred embodiment, the analog-to-digital converter employs a sigma delta modulator.

In a preferred embodiment, the sensing node of the charge coupled device stage includes a floating diffusion, and the charge coupled device stage includes a transfer gate overlying the substrate between the floating diffusion and the photogate. This preferred embodiment can further include apparatus for periodically resetting a potential of the sensing node to a predetermined potential, including a drain diffusion connected to a drain bias voltage and a reset gate between the floating diffusion and the drain diffusion, the reset gate connected to a reset control signal.

Preferably, the output transistor is a field effect source follower transistor, the floating diffusion being connected to a gate of the source follower transistor. Preferably, the readout circuit further includes a double correlated sampling circuit having an input node connected to the output transistor. In the preferred implementation, the double correlated sampling circuit samples the floating diffusion immediately after it has been reset at one capacitor and then, later, at the end of the integration period at another capacitor. The difference between the two capacitors is the signal output. In accordance with a further refinement, this difference is corrected for fixed pattern noise by subtracting from it another difference sensed between the two capacitors while they are temporarily shorted.

DESCRIPTION OF THE PREFERRED EMBODIMENTS

Figure 1:
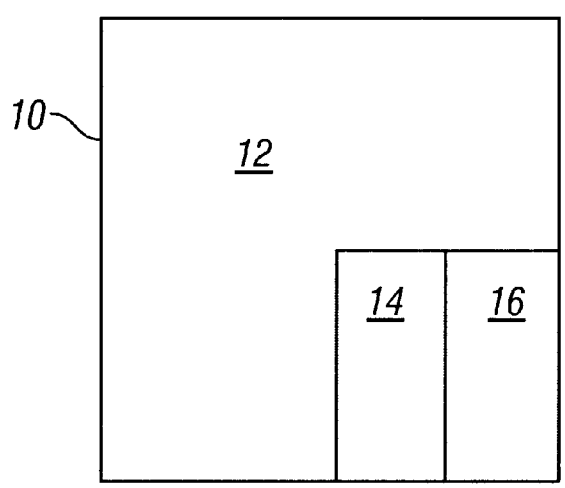
FIG. 1 is a diagram illustrating the architecture of an individual focal plane cell of the invention.
Figure 2:
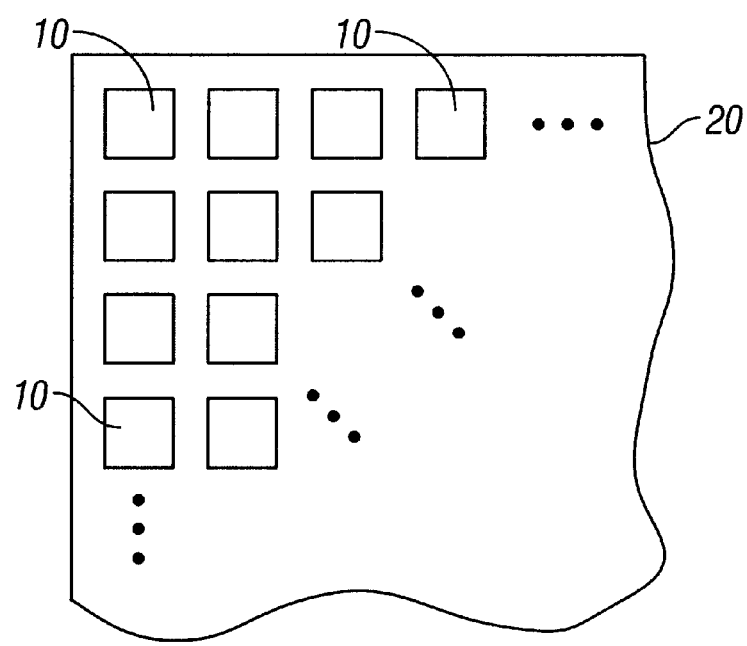
FIG. 2 is a plan view of an integrated circuit constituting a focal plane array of cells of the type illustrated in FIG. 1.
Figure 3:
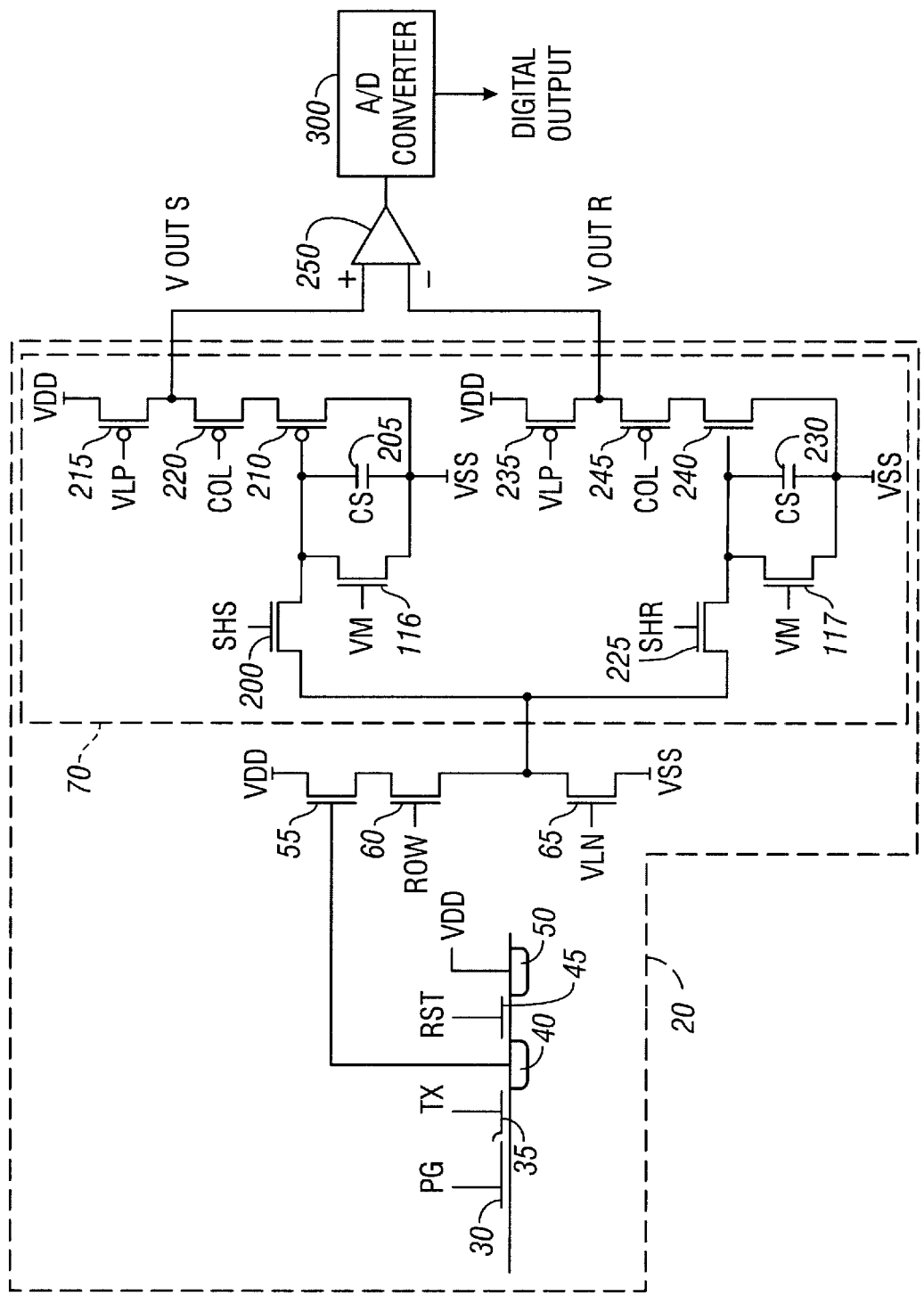
FIG. 3 is a schematic diagram of the cell in FIG. 1.

FIG. 1 is a simplified block diagram of one pixel cell 10 of a focal plane array of many such cells formed in an integrated circuit. Each cell 10 includes a photogate 12, a charge transfer section 14 adjacent the photogate 12 and a readout circuit 16 adjacent the charge transfer section 14. FIG. 2 shows a focal plane array of many cells 10 formed on a silicon substrate 20. FIG. 3 is a simplified schematic diagram of a cell 10. Referring to FIG. 3, the photogate 12 consists of a relative large photogate electrode 30 overlying the substrate 20. The charge transfer section 14 consists of a transfer gate electrode 35 adjacent the photogate electrode 30, a floating diffusion 40, a reset electrode 45 and a drain diffusion 50. The readout circuit 16 consists of a source follower field effect transistor (FET) 55, a row select FET 60, a load FET 65 and a correlated double sampling circuit 70.

Figure 4:
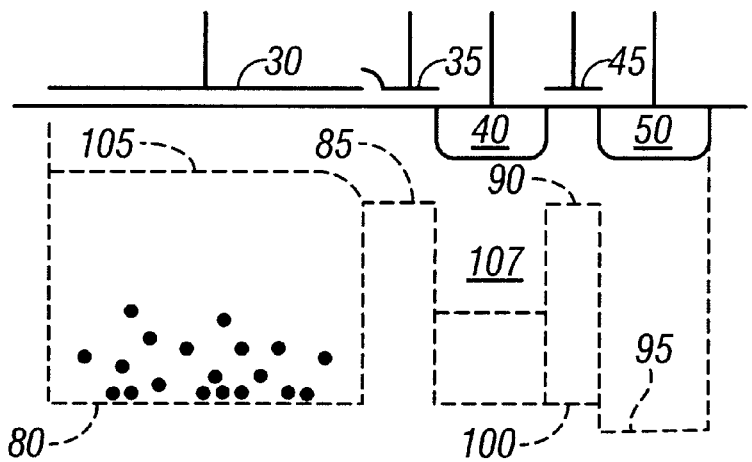
FIG. 4 is a graph of the surface potential in the charge transfer section of the cell of FIG. 3.

Referring to the surface potential diagram of FIG. 4, the photogate electrode 30 is held by a photogate signal PG at a positive voltage to form a potential well 80 in the substrate 20 in which photo-generated charge is accumulated during an integration period. The transfer gate electrode 35 is initially held at a less positive voltage by a transfer gate signal TX to form a potential barrier 85 adjacent the potential well 80. The floating diffusion 40 is connected to the gate of the source follower FET 55 whose drain is connected to a drain supply voltage VDD. The reset electrode 45 is initially held by a reset signal RST at a voltage corresponding to the voltage on the transfer gate 30 to form a potential barrier 90 thereunder. The drain supply voltage VDD connected to the drain diffusion 50 creates a constant potential well 95 underneath the drain diffusion 50.

During the integration period, electrons accumulate in the potential well 80 in proportion to photon flux incident on the substrate 20 beneath the photogate electrode 30m. At the end of the integration period, the surface potential beneath the floating diffusion 40 is quickly reset to a potential level 100 slightly above the potential well 95. This is accomplished by the reset signal RST temporarily increasing to a higher positive voltage to temporarily remove the potential barrier 90 and provide a downward potential staircase from the transfer gate potential barrier 85 to the drain diffusion potential well 95, as indicated in the drawing of FIG. 4. After the reset gate 45 is returned to its initial potential (restoring the potential 20 barrier 90), the readout circuit 70 briefly samples the potential of the floating diffusion 40, and then the cell 10 is ready to transfer the photo-generated charge from beneath the photogate electrode 30. For this purpose, the photogate signal PG decreases to a less positive voltage to form a potential barrier 105 beneath the photogate electrode 30 and thereby provide a downward staircase surface potential from the photogate electrode 30 to the potential well 100 beneath the floating diffusion 40. This transfers all of the charge from beneath the photogate electrode 30 to the floating diffusion 40, changing the potential of the floating diffusion 40 from the level (100) at which it was previously reset to a new level 107 indicative of the amount of charge accumulated during the integration period. This new potential of the floating diffusion 40 is sensed at the source of the source follower FET 55. However, before the readout circuit 70 samples the source of the source follower FET 55, the photogate signal PG returns to its initial (more positive) voltage. The entire process is repeated for the next integration period.

The readout circuit 70 consists of a signal sample and hold (S/H) circuit including an S/H FET 200 and a signal store capacitor 205 connected through the S/H FET 200 and through the row select FET 60 to the source of the source follower FET 55. The other side of the capacitor 205 is connected to a source bias voltage VSS. The one side of the capacitor 205 is also connected to the gate of an output FET 210. The drain of the output FET is a connected through a column select FET 220 to a signal sample output node VOUTS and through a load FET 215 to the drain voltage VDD. A signal called "signal sample and hold" (SHS) briefly turns on the S/H FET 200 after the charge accumulated beneath the photogate electrode 30 has been transferred to the floating diffusion 40, so that the capacitor 205 stores the source voltage of the source follower FET 55 indicating the amount of charge previously accumulated beneath the photogate electrode 30.

The readout circuit 70 also consists of a reset sample and hold (S/H) circuit including an S/H FET 225 and a signal store capacitor 230 connected through the S/H FET 225 and through the row select FET 60 to the source of the source follower FET 55. The other side of the capacitor 230 is connected to the source bias voltage VSS. The one side of the capacitor 230 is also connected to the gate of an output FET 240. The drain of the output FET 240 is connected through a column select FET 245 to a reset sample output node VOUTR and through a load FET 235 to the drain voltage VDD. A signal called "reset sample and hold" (SHR) briefly turns on the S/H FET 225 immediately after the reset signal RST has caused the resetting of the potential of the floating diffusion 40, so that the capacitor 230 stores the voltage at which the floating diffusion has been reset to.

The readout circuit provides correlated double sampling of the potential of the floating diffusion, in that the charge integrated beneath the photogate 12 each integration period is obtained at the end of each integration period from the difference between the voltages at the output nodes VOUTS and VOUTR of the readout circuit 70. This eliminates the effects of kTC noise because the difference between VOUTS and VOUTR is independent of any variation in the reset voltage RST, a significant advantage.

Figure 5:
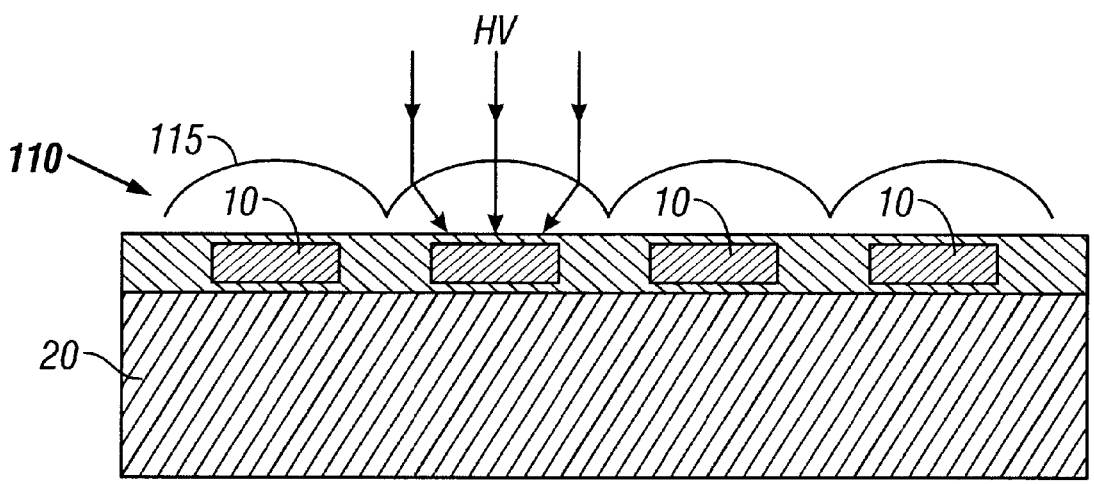
FIG. 5 is a cross-sectional view of an alternative embodiment of the focal plane array of FIG. 2 including a microlens layer.

Referring to FIG. 5, a transparent refractive microlens layer 110 may be deposited overt the top of the focal plane array of FIG. 2. The microlens layer 110 consists of spherical portions 115 centered over each of the cells 10 and contoured so as to focus light toward the center of each photogate 12. This has the advantage of using light that would otherwise fall outside of the optically active region of the photogate 12. For example, at least some of the light ordinarily incident on either the charger transfer section 14 or the readout circuit 16 (FIG. 1) would be sensed in the photogate area with the addition of the microlens layer 110.

Preferably, the focal plane array corresponding to FIGS. 1–4 is implemented in CMOS silicon using an industry standard CMOS fabrication process. Preferably, each of the FETs is a MOSFET, the FETs 210, 220, 215, 235, 240, 245 being p-channel devices. The n-channel MOSFETS and the CCD channel underlying the gate electrodes 30, 35, 45 and the diffusions 40 and 50 may be located outside of the p-well. The gate voltage VLP applied to the gates of the p-channel load FETs 215 and 235 is a constant voltage on the order of ±2.5 volts. The gate voltage VLN applied to the n-channel load FET 65 is a constant voltage on the order of ±1.5 volts.

Since the charge transfer section 14 involves only a single CCD stage between the photogate 12 and the floating diffusion 40 in the specific embodiment of FIG. 3, there is no loss due to charge transfer inefficiency and therefore there is no need to fabricate the device with a special CCD process. As a result, the readout circuit 70 as well as the output circuitry of the FETs 55, 60 and 65 can be readily implemented as standard CMOS circuits, making them extremely inexpensive. However, any suitable charge coupled device architecture may be employed to implement the charge transfer section 14, including a CCD having more than one stage. For example, two or three stages may be useful for buffering two or three integration periods.

Other implementations of the concept of the invention may be readily constructed by the skilled worker in light of the foregoing disclosure. For example, the floating diffusion 40 may instead be a floating gate electrode. The signal and reset sample and hold circuits of the readout circuit 70 may be any suitable sample and hold circuits. Moreover, shielding of the type well-known in the art may be employed defining an aperture surrounding the photogate 12. Also, the invention may be implemented as a buried channel device.

Another feature of the invention which is useful for eliminating fixed pattern noise due to variations in FET threshold voltage across the substrate 20 is a shorting FET 116 across the sampling capacitors 205, 235. After the accumulated charge has been measured as the potential difference between the two output nodes VOUTS and VOUTR, a shorting signal VM is temporarily applied to the gate of the shorting FET 116 and the VOUTS-to-VOUTR difference is measured again. This latter difference is a measure of the disparity between the threshold voltages of the output FETs 210, 240, and may be referred to as the fixed pattern difference. The fixed pattern difference is subtracted from the difference between VOUTS and VOUTR measured at the end of the integration period, to remove fixed pattern noise.

As previously mentioned herein, a floating gate may be employed instead of the floating diffusion 40. Such a floating gate is indicated schematically in FIG. 3 by a simplified dashed line floating gate electrode 41.

Preferably, the invention is fabricated using an industry standard CMOS process, so that all of the dopant concentrations of the n-channel and p-channel devices and of the various diffusions are in accordance with such a process. In one implementation, the area of the L-shaped photogate 12 (i.e., the photogate electrode 30) was about 100 square microns; the transfer gate electrode 35 and the reset gate electrode were each about 1.5 microns by about 6 microns; the photogate signal PG was varied between about ±5 volts (its more positive voltage) and about 0 volts (its less positive voltage); the transfer gate signal TX was about ±2.5 volts; the reset signal RST was varied between about ±5 volts (its more positive voltage) and about ±2.5 volts (its less positive voltage); the drain diffusion 50 was held at about ±5 volts.

Combination with Analog-to-Digital Converter

Each pixel cell 10 in the array of FIG. 2 may further include its own analog-to-digital converter 300, as shown in FIG. 3. As shown in FIG. 3, the analog input to the analog-to-digital converter 300 is connected to the output of difference amplifier 250, which is the output node of the readout circuit 70.

Figure 6:
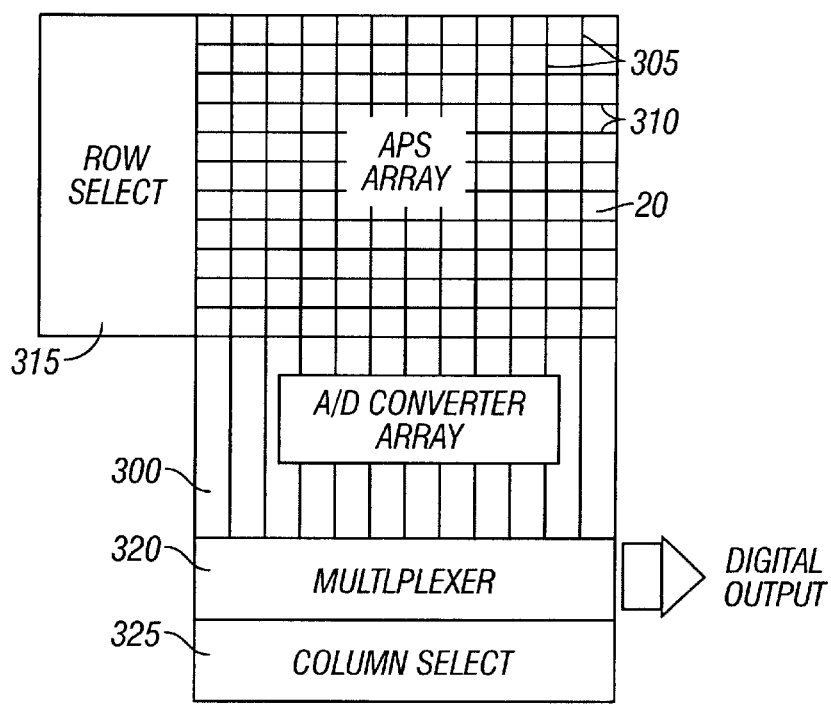
FIG. 6 is a plan view of an integrated circuit embodying the invention.
Figure 7:
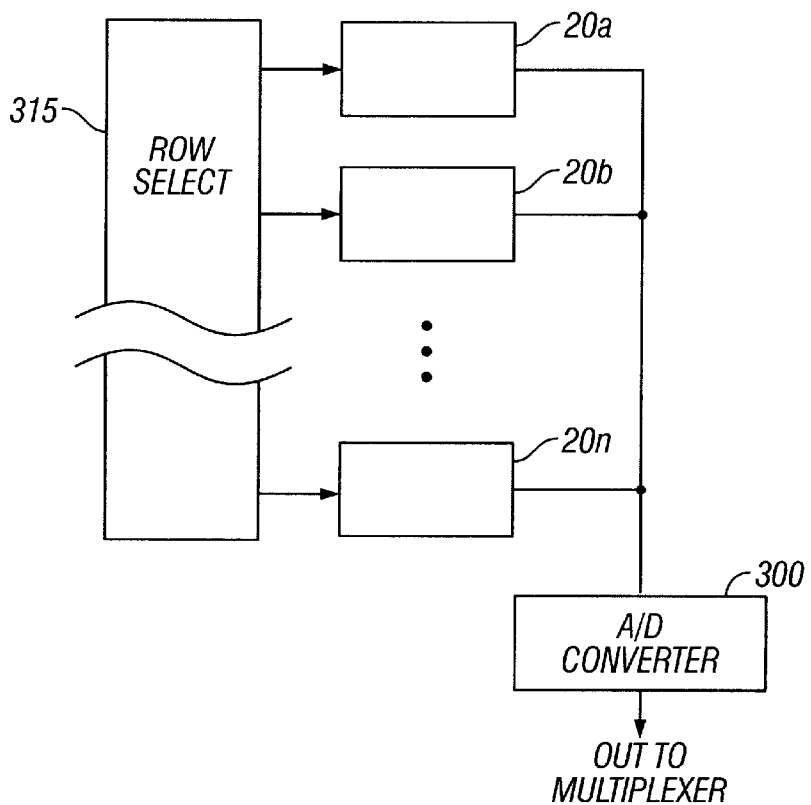
FIG. 7 is a schematic diagram of one column of pixel cells in the integrated circuit of FIG. 6.

The preferred mode is illustrated in FIG. 6, in which each vertical column 305 of pixel cells 10 in the array of FIG. 2 have their output nodes connected to a common analog-to-digital converter 300 at the bottom of the column. Each horizontal row 310 of the pixel cells 10 have their output node simultaneously connected to the analog-to-digital converters 300 of the respective columns under the control of a conventional row-select circuit 315. The row-select circuit 315 has an individual output connected to the gates of the row select transistors 60 of each pixel cell 10 in a given row of pixel cells 10. The outputs of the array of analog-to-converters 300 are connected in a manner well-known in the art to a conventional multiplexer 320 controlled by a conventional column select circuit 325. FIG. 7 illustrates how one column 305 of pixel cells 10 is connected to a common analog-to-digital converter 300 under control of the row select circuit 315.

The semi-parallel architecture of FIG. 6 was chosen as a trade-off between a serial system of the prior art having a single A/D converter and the completely parallel system depicted in FIG. 3 having an A/D converter for each pixel. A major disadvantage of the serial system is that it requires high operating speeds since conversion of each pixel must be done sequentially. This in turn introduces resolution problems due to the limited accuracy attainable at high conversion rates. On the other hand, a completely parallel system reduces the required operating speed but requires too much area to be included in each pixel. With a semi-parallel architecture, where an entire column of pixels shares a single A/D converter, the area available for each converter is limited mostly by the pixel pitch, and the number of conversions is proportional to the number of rows rather than the total number of pixels.

In one implementation of the embodiment of FIG. 6, the imaging area is a 128×128 array of active pixel sensors which is scanned row by row. The row-control circuit 315 decodes the 7-bit row-address and provides the clock signals needed by each row 310 of pixel cells 10. Each column 305 of pixel cells 10 shares a single A/D converter 300 and the array of converters 300 operate in parallel to convert a row of pixel outputs. The column control circuit 325 decodes the 7-bit column address for the readout operation and controls the gates of the column select transistors 220, 240 in each pixel cell 10.

Sigma-Delta A/D Converter

Preferably, each analog-to-digital (A/D) converter 300 of FIG. 6 employs oversampled sigma delta modulation. A/D conversion based on oversampled sigma-delta modulation was selected since it has been proven to be well-suited for VLSI applications where high conversion rate is not a requirement. Due to the averaging nature of sigma-delta modulation, it is more robust against threshold variations and inadvertent comparator triggering than single-slope/dual-slope methods and requires less component accuracy than successive approximation methods. It also uses less power and real estate than flash A/D converters. A semi-parallel architecture with an array of A/D converters reduces the conversion rate of each converter sufficiently to allow the use of sigma-delta modulation. Sigma-delta modulation is suitable for VLSI circuits since it is easier to achieve high oversampling ratios than to produce precise analog components in order to reduce component mismatch.

First-order sigma-delta modulation with a single-bit or two-level quantizer is preferred since it is simple, compact, robust and stable against overloading. The output of such a modulator can be filtered by taking a simple average over a fixed number of bits. To generate an N-bit digital word, $2^N$ output bits are averaged for each pixel.

Figure 8:
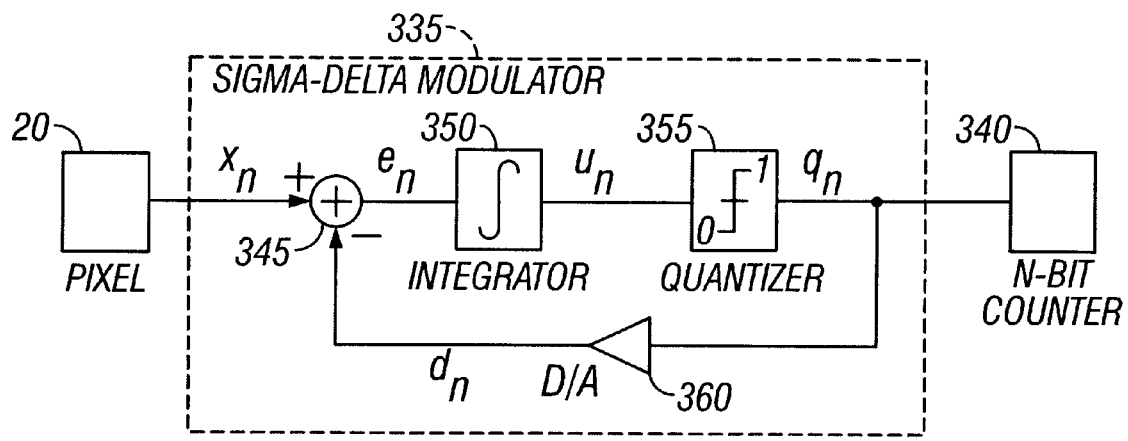
FIG. 8 is a schematic block diagram of a preferred embodiment of the invention.

Since its introduction 30 years ago, oversampled sigma-delta modulation has become a popular method for A/D conversion. Sigma-delta modulation uses oversampling and integration of the signal prior to quantization to increase the correlation between samples and decrease the quantization error. Referring to FIG. 8, each A/D converter 300 consists of a first-order oversampled sigma-delta 340. The counter outputs are latched at the end of each conversion period and read out while the outputs of the next row of pixel cells 10 is being converted. The main components of the first-order sigma-delta modulator A/D converter 335 are a differencing node 345, an integrator 350, a quantizer 355 and a feedback digital-to-analog (D/A) converter 360. The quantities $x_n$, $u_n$, $q_n$, $d_n$ and $e_n$ are, respectively, the incoming analog signal, the output of the integrator 350, the output of the quantizer 355, the output of the D/A converter 360 and the quantizer error during the n-th cycle.

During each pixel conversion period, the input to the sigma-delta modulator 335 is the analog output signal from the pixel cell 10, which remains nearly constant at a value between 0 and $X_{max}$. The two level-quantizer 355 is a comparator with threshold equal to $V_{ref}$ corresponding to $X_{max}$ and output level corresponding to a digital "1" and "0". In this case, the feedback D/A converter 360 is a switch that chooses between two preset levels depending on the comparator output $q_n$.

Figure 9:
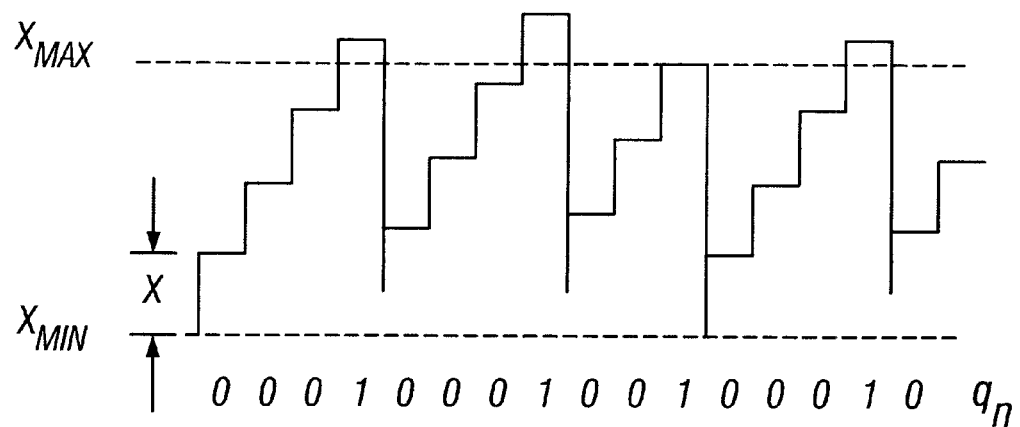
FIG. 9 is a graph of a time domain waveform of the output of a modulator employed in the analog-to-digital converter depicted in FIG. 8.

The operation of the sigma-delta modulator of FIG. 8 is illustrated in FIG. 9. During each cycle, the difference node 345 subtracts the previous output of the D/A converter 360 from the current analog input $X_n$. When the integrator output crosses the comparator threshold, an amount equal to the full scale $X_{max}$ is subtracted during the following cycle. Therefore, the quantizer output $q_n$ oscillates between "0" and "1" such that the average over many cycles is approximately equal to the input. This can be summarized by the recursive relations $$u_n = u_{n-1} + e_{n-1}$$

$$e_{n-1} = x_{n-1} - d_{n-1}$$

where $$d_{n-1} + 0 \text{ for } q_n = 0$$

$$d_{n-1} = x_{max} \text{ for } q_n = 1$$

In the embodiment of FIG. 8, $q_n$ is averaged over 1024 samples by counting the number of "1"'s using the 10-bit ripple counter 340.

Preferred Sigma-Delta Modulator Circuit

Figure 10:
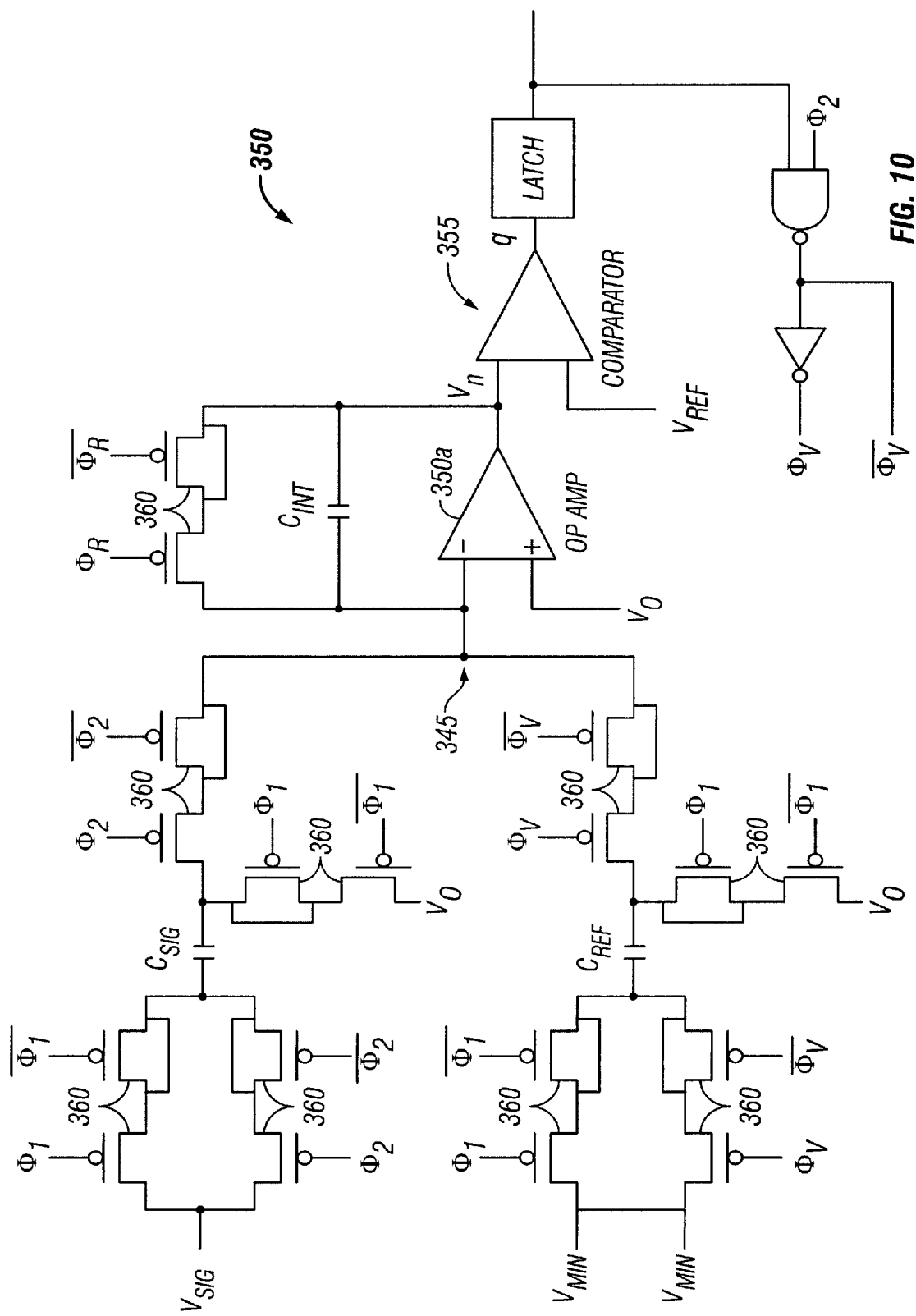
FIG. 10 is a schematic diagram of the modulator employed in the embodiment of FIG. 8.

The sigma-delta modulator 335 of FIG. 8 is implemented with the switched capacitor integrator and comparator circuit shown in FIG. 10. The integrator 350 has two input branches, one to add the signal and the other to subtract the full scale. P-type MOSFET switches 360 are used since they show better noise performance than N-type switches. MOS capacitors $C_{sig}$, $C_{ref}$ and $C_{int}$, which are controlled by complementary clock signals, are included in the signal path to reduce switch feed-through. The switched-capacitors $C_{sig}$ and $C_{ref}$, and the integrating capacitor $C_{int}$ should be large to minimize kTC noise, but the size is limited mainly by the ability of the source-follower to drive them at the oversampling rate and the available area under each column of pixels. Therefore, all the capacitors are designed to be poly1-poly2 capacitors of 1 pF.

The control signals $\phi_1$ and $\phi_2$ are two non-overlapping clocks that read the two signal levels of the pixel output. Clock $\phi_v$ is synchronous with $\phi_2$, and is generated from the output of the comparator so that it is on only when the comparator output is "1". During each cycle, the amplitude of the modulated signal ($\Delta V_{sig}$) is integrated across Cint. In addition, when the comparator output is "1", the maximum signal swing ($\Delta V_{max}$) is subtracted from the integrator output. A reset switch is included across the feedback capacitor to reset the integrator at the beginning of each pixel conversion. If it is assumed that the op amp and the switches are ideal, the difference equation describing this operation for the n-th cycle can be written as:

$$Vout_n = Vout_{n-1} + [C_{sig}/C_{int}]Vsig_n - [C_{ref}/C_{int}]Vq_n$$

where $V_q$ is 0 when q is "0" and $V_q$ is Vmax when q is "1".

The quantizer 355 is a conventional strobed comparator whose inputs are the integrator output and a reference level $V_{ref}$ corresponding to the full scale of the input $X_{max}$.

The latched output of the quantizer comparator 355 is used to generate the clock signal v and its complement for the next integration cycle. It is also used to generate the two non-overlapping clocks required as inputs to the counter.

The conventional 10-bit binary counter 340 that averages the output of the sigma-delta modulator has 10 pipelined stages with a counter-cell and latch in each stage. The inputs to the first counter stage are the signals generated from the quantizer output. The inputs to the other stages are the outputs from the previous stage. Each counter cell is reset to zero at the beginning of a pixel conversion. The sigma-delta modulator output is averaged by counting the number of "1"s out during the next conversion period. Since the linear array of sigma-delta modulators and counters operate in parallel to convert a row of pixels at a time, the latched counter outputs are read out column by column during the next conversion period.

Other Types of Digital-to-Analog Converters

Figure 11:
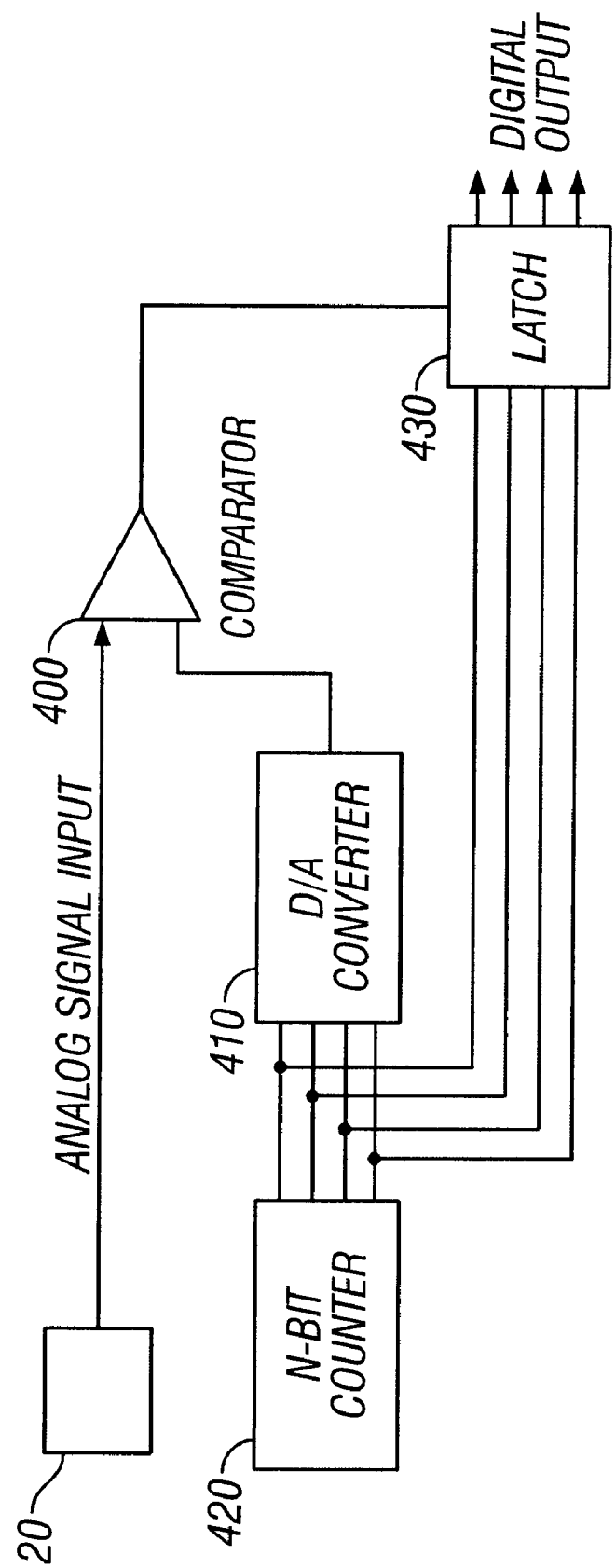
FIG. 11 is a schematic diagram of an alternative embodiment of the invention.

In one alternative embodiment of the invention, illustrated as FIG. 11, the analog-to-digital converter 300 is a conventional single-slope analog-to-digital converter. In this embodiment, a comparator 400 compares the analog pixel cell output with the output of a feedback D/A converter 410 whose input is the output of an N-bit up-counter 420. As soon as the two inputs to the comparator 400 are equal, the comparator output changes state, causing a latch 430 to latch the output of the N-bit counter 420 to the digital output of the A/D converter.

In another alternative embodiment of the invention, the analog-to-digital converter employs the well-known algorithm of successive approximations. In this embodiment, the analog-to-digital converter encodes an analog signal, S, as a sum of powers of ½:

$$S = \sum_{n=1}^{M} b_n(2)^{-n} \text{ (for an } M\text{-bit A/D converter)}$$

where $b_n$'s are 1 or 0, and the full scale reference is taken to be 1.0. The conventional successive approximation algorithm for determining the $b_n$'s is to compare S with $$R_k = \sum_{n=1}^{k-1} b_n 2^{-n} + 2^{-k}$$

for the kth bit conversion. If S exceeds $R_k$, $b_k=1$ and if S is less than $R_k$, $b_k=0$. The K=1 reference then becomes:

$$R_{k+1} = R_k - b_k 2^{-k} + 2^{-(k+1)}$$

where a subtraction is involved. ($b_k=0, 1$ for $b_k=1,0$ respectively).

Stating the above nonmathematically, the signal S is progressively compared with $$R = ½, ½+¼, ½+¼+⅛, \text{ etc.}$$

As soon as R exceeds S, the last added fraction (⅛) must be subtracted and the next in the series of (½$^n$) (e.g., ⅟₁₆) added.

The approximations then continue by successively adding progressively smaller members of the serial (½ⁿ) to R until it again exceeds S, at which time the member of the series (say, 1/32) which caused R to exceed S is subtracted from R and, prior to the next comparison, the next member in the series (1/64) is added to R. The process continues through a series of approximations depending in number on the desired precision of the system.

While the invention has been described in detail by specific reference to preferred embodiments, it is understood that variations and modifications may be made without departing from the true spirit and scope of the invention.

What is claimed is:

1. An imaging device, comprising:
   a semiconductor substrate defining a plurality of pixel cell areas, and a signal handling area;
   each said pixel cell area comprising:
   a) a photogate overlying said substrate, accumulating photo-generated charge in an underlying portion of said substrate;
   b) a charge transfer section, receiving the accumulated photo-generated charge from the photogate; and
   c) a coupling section, formed on said substrate adjacent said charge transfer section, having a sensing node connected to said photogate through said charge transfer section, wherein said charge transfer section transfers stored charge from said photogate to said sensing node;
   d) a buffer transistor, operating to buffer signal from said sensing node, and a selection transistor, having a gate, operated to select said pixel; and
   e) an output node which receives signal only when said selection transistor is operated;
   a focal plane array including a plurality of logic units, each unit of said focal plane array including a plurality of said pixel cells, each unit having said output nodes of all of said pixels connected together, and further comprising:
   a readout controller, formed in said substrate, which controls readout of said pixel cells to read out one pixel cell from each of the plurality of units, substantially at the same time; and
   a plurality of analog to digital converters, formed in said substrate, and each connected to an output node of a unit to read out information from said pixel cells from multiple said units in parallel.

2. An imaging device as in claim 1 further comprising a correlated double-sampling circuit, associated with each of said pixel cells, formed on said substrate.

3. An imaging device, comprising:
   a semiconductor substrate defining a plurality of pixel cell areas, and a signal handling area;
   each said pixel cell area comprising:
   a) a photogate; and
   b) a coupling section formed on said substrate adjacent said photogate, having a sensing node connected to receive a signal indicative of photogenerated charge from said photogate and at least one coupling stage, operating to transfer charge from said underlying portion of said substrate to said sensing node;
   d) a buffer transistor, operating to buffer signal from said sensing node, and a selection transistor, having a gate, operated to select said pixel; and
   e) an output node which receives signal only when said selection transistor is operated.

4. An imaging device comprising a focal plane array of pixel cells, each of said pixel cells including a monolithic semiconductor integrated circuit substrate, each of said pixel cells comprising:
   a) a photogate overlying a first portion of said substrate and operating to accumulate photo-generated charge in a first portion of said substrate that underlies said photogate;
   b) a charge transfer section, formed in said substrate adjacent said photogate, having a sensing node adjacent said photogate and at least one charge coupling stage, operating to transfer charge from said first portion of said substrate to said sensing node;
   c) an output node; and
   d) a transistor which selectively connects said sensing node to said output node,
   and further comprising a plurality of A/D converters, connected to said output nodes of a plurality of said pixel cells, but less than all of said pixel cells, so that less than all of said pixel cells are attached to said A/D converter.

5. A device as in claim 4 wherein said A/D converter is of a type that averages over a plurality of cycles.

6. A device as in claim 4 wherein said A/D converters are sigma delta A/D converters.

7. A device as in claim 6 wherein each said sigma delta A/D converter includes an analog value summing element with inputs and an output, an integrator, which averages an output of the analog value summing element, a quantizer, which characterizes said output as being either a "1" or a "0", an N bit counter which counts a number of times that said quantizer is 1 and a number of times said quantizer is 0, and a D/A converter which produces an analog value based on an output of said quantizer, said analog values being coupled to one of said inputs of said summing element.

8. A device as in claim 7 wherein said quantizer is a single bit quantizer and a D/A converter is a single bit D/A converter.

9. A device as in claim 5 wherein said sigma delta modulator circuit is formed with switched MOS capacitors.

10. A device as in claim 4 wherein said A/D converter uses switched MOS capacitors.

11. A method of forming and using an imaging device, comprising:
   defining a plurality of pixel areas, each said pixel area covering a specified area of a charge accumulating substrate;
   configuring each of said plurality of pixel areas as a portion of said substrate,
   providing a photogate controlling a characteristic of each said portion of said charge accumulating substrate;
   providing a sensing node which senses charge in said portion of said charge accumulating substrate;
   selectively passing a value in said sensing node to an output node associating an A/D converter circuit with each of a plurality of unit groups of said output nodes of each pixel areas; and
   connecting each output node within each said unit group to each other and passing only one output therefrom to said A/D converter to thereby read a plurality of said unit groups in parallel.

12. A method as in claim 11, further comprising subsequently connecting each node of another unit group of sensing nodes to a dedicated A/D converter, to thereby simultaneously read all nodes of said another unit group at once, at a time after said time of reading said each node.

* * * * *